US012575439B2

(12) United States Patent
Hori et al.

(10) Patent No.: US 12,575,439 B2
(45) Date of Patent: Mar. 10, 2026

(54) SEMICONDUCTOR DEVICE INCLUDING A SEALING MEMBER TO SEAL A SEMICONDUCTOR CHIP, A PRINTED CIRCUIT BOARD, AND A CONDUCTIVE BLOCK

(71) Applicant: FUJI ELECTRIC CO., LTD., Kawasaki (JP)

(72) Inventors: Motohito Hori, Matsumoto-city (JP); Yoshinari Ikeda, Matsumoto-city (JP); Akira Hirao, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 50 days.

(21) Appl. No.: 17/752,339

(22) Filed: May 24, 2022

(65) Prior Publication Data
US 2022/0406689 A1 Dec. 22, 2022

(30) Foreign Application Priority Data
Jun. 16, 2021 (JP) ................................. 2021-100346

(51) Int. Cl.
| | |
|---|---|
| *H01L 23/49* | (2006.01) |
| *H01L 23/31* | (2006.01) |
| *H01L 23/373* | (2006.01) |
| *H01L 23/498* | (2006.01) |
| *H01L 25/07* | (2006.01) |

(52) U.S. Cl.
CPC .......... *H01L 23/49* (2013.01); *H01L 23/3121* (2013.01); *H01L 23/3735* (2013.01); *H01L 23/49844* (2013.01); *H01L 25/072* (2013.01)

(58) Field of Classification Search
None
See application file for complete search history.

(56) References Cited

U.S. PATENT DOCUMENTS

| | | | | |
|---|---|---|---|---|
| 2002/0158332 | A1* | 10/2002 | Masayuki | ........... H01L 23/3737 257/E23.09 |
| 2006/0209517 | A1* | 9/2006 | Yui | .................... H01L 23/49816 257/E23.105 |

(Continued)

FOREIGN PATENT DOCUMENTS

| | | |
|---|---|---|
| JP | 10-270609 A | 10/1998 |
| JP | 2004-22705 A | 1/2004 |

(Continued)

OTHER PUBLICATIONS

Japanese Office Action dated Jan. 28, 2025 for Japanese Application No. 2021-100346.

*Primary Examiner* — Sue A Purvis
*Assistant Examiner* — Seyon Ali-Simah Punchbeddell

(57) ABSTRACT

A semiconductor device includes: an insulated circuit substrate including a conductive plate on a top surface side; a semiconductor chip mounted on the conductive plate; a printed circuit board provided over and electrically connected to the semiconductor chip; a first external connection terminal electrically connected to the conductive plate and extending upward from the conductive plate; a first conductive block provided to surround an outer circumference of the first external connection terminal in an insulated state; and a sealing member provided to seal the semiconductor chip, the printed circuit board, and the first conductive block.

12 Claims, 15 Drawing Sheets

(56)                    References Cited

U.S. PATENT DOCUMENTS

| | | | | |
|---|---|---|---|---|
| 2013/0075886 A1* | 3/2013 | Abe | .................... | H02M 7/003 |
| | | | | 257/E25.027 |
| 2014/0355219 A1* | 12/2014 | Tada | .................... | H05K 1/117 |
| | | | | 361/729 |
| 2020/0118986 A1* | 4/2020 | Hori | .................... | H01L 23/427 |
| 2020/0395385 A1* | 12/2020 | Yu | .................... | H01L 23/5226 |
| 2021/0020604 A1* | 1/2021 | Nakamura | ............ | H01L 21/565 |

FOREIGN PATENT DOCUMENTS

| | | | | |
|---|---|---|---|---|
| JP | 2010-11734 | A | | 1/2010 |
| JP | 2016146444 | A | * | 8/2016 |
| JP | 2017-199752 | A | | 11/2017 |

* cited by examiner

F I G. 1
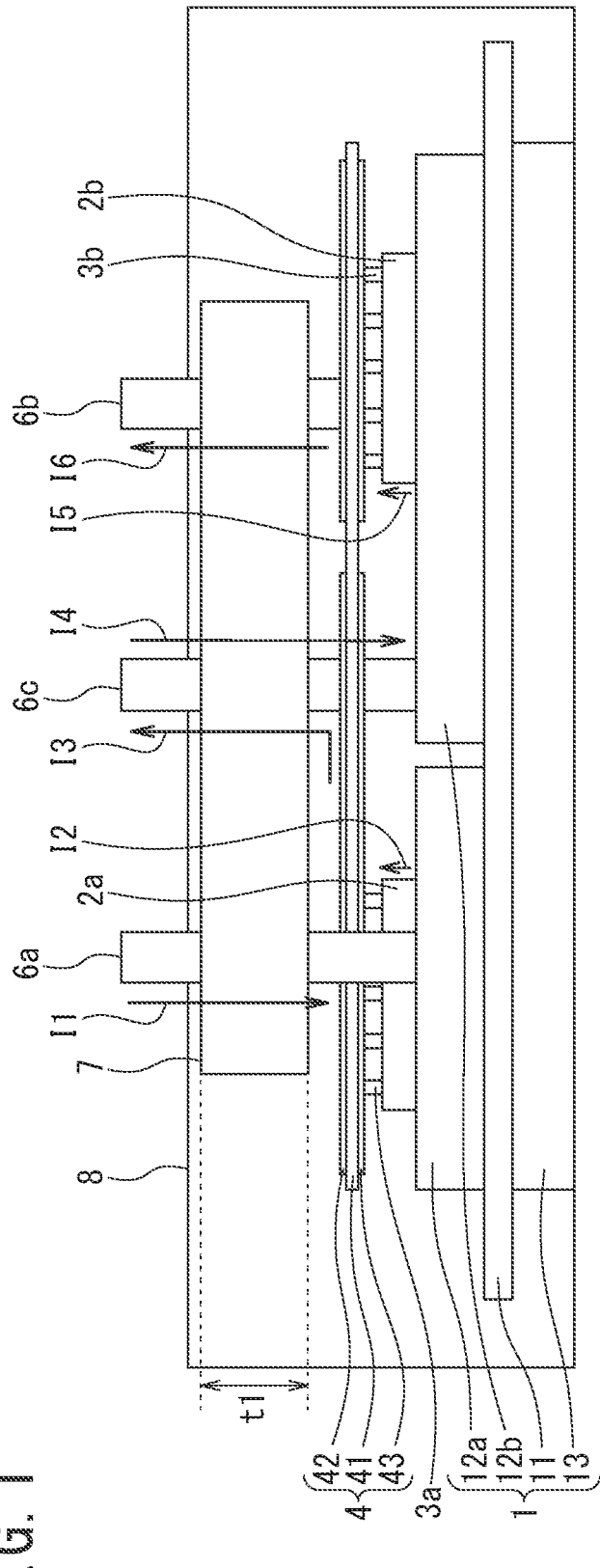

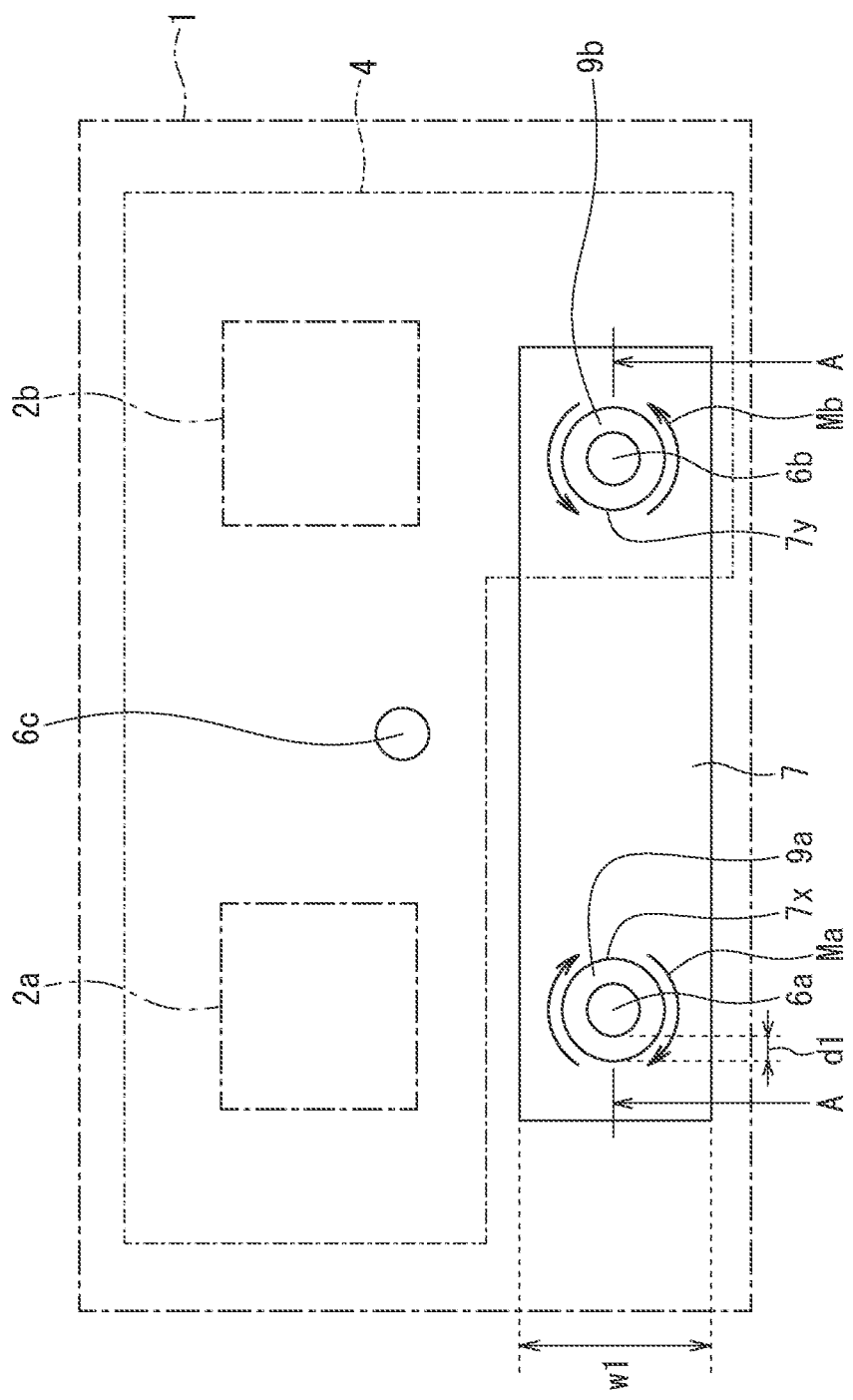
F I G. 2

F I G. 5
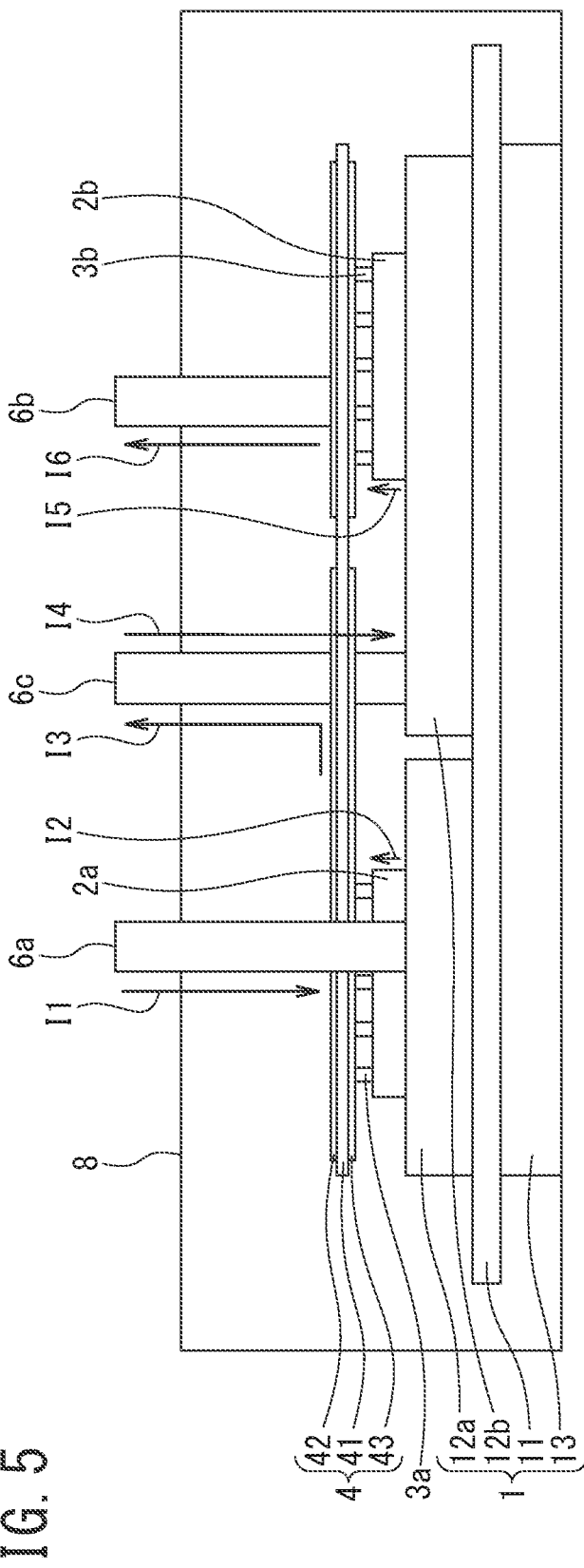

F I G. 11
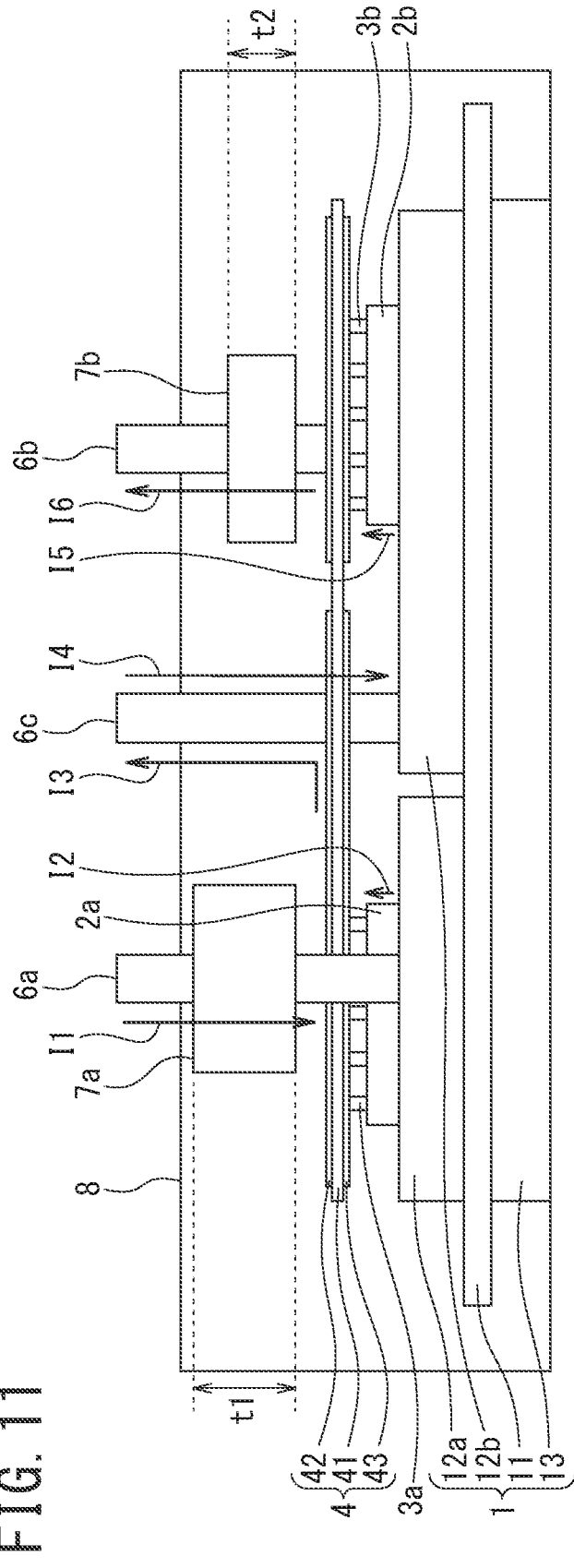

SEMICONDUCTOR DEVICE INCLUDING A SEALING MEMBER TO SEAL A SEMICONDUCTOR CHIP, A PRINTED CIRCUIT BOARD, AND A CONDUCTIVE BLOCK

CROSS-REFERENCE TO RELATED APPLICATION

This application claims benefit of priority under 35 USC 119 based on Japanese Patent Application No. 2021-100346 filed on Jun. 16, 2021, the entire contents of which are incorporated by reference herein.

BACKGROUND

1. Field of the Invention

The present invention relates to a semiconductor device (a semiconductor module) equipped with a power semiconductor element inside the device.

2. Description of the Related Art

Power semiconductor elements are used as a switching element for power conversion, for example. A semiconductor device equipped with such a conventional power semiconductor element inside the device is known that has a structure in which a power semiconductor chip (referred to simply below as a "semiconductor chip") implementing the power semiconductor element is provided on an insulated circuit substrate, and a printed circuit board is arranged over the semiconductor chip.

JP2010-11734 A discloses a semiconductor power module, as illustrated in FIG. 1C, in which a ring-shaped magnetic member is arranged to surround terminals connected to a power semiconductor element provided inside a module package.

The semiconductor device equipped with the conventional power semiconductor element inside the device may cause a surge voltage due to a parasitic inductance upon a switching operation of the power semiconductor element.

SUMMARY

In view of the foregoing issue, the present invention provides a semiconductor device having a configuration capable of reducing a parasitic inductance in wires inside a semiconductor device equipped with a power semiconductor element.

An aspect of the present invention inheres in a semiconductor device including: an insulated circuit substrate including a conductive plate on a top surface side; a semiconductor chip mounted on the conductive plate; a printed circuit board provided over and electrically connected to the semiconductor chip; a first external connection terminal electrically connected to the conductive plate and extending upward from the conductive plate; a first conductive block provided to surround an outer circumference of the first external connection terminal in an insulated state; and a sealing member provided to seal the semiconductor chip, the printed circuit board, and the first conductive block.

BRIEF DESCRIPTION OF THE DRAWINGS

FIG. 1 is a side view illustrating a semiconductor device according to a first embodiment;

FIG. 2 is a plan view illustrating a part of the semiconductor device according to the first embodiment;

FIG. 5 is a side view of a semiconductor device of a comparative example;

FIG. 11 is a side view illustrating a semiconductor device according to a third embodiment;

DETAILED DESCRIPTION

Figure 3:
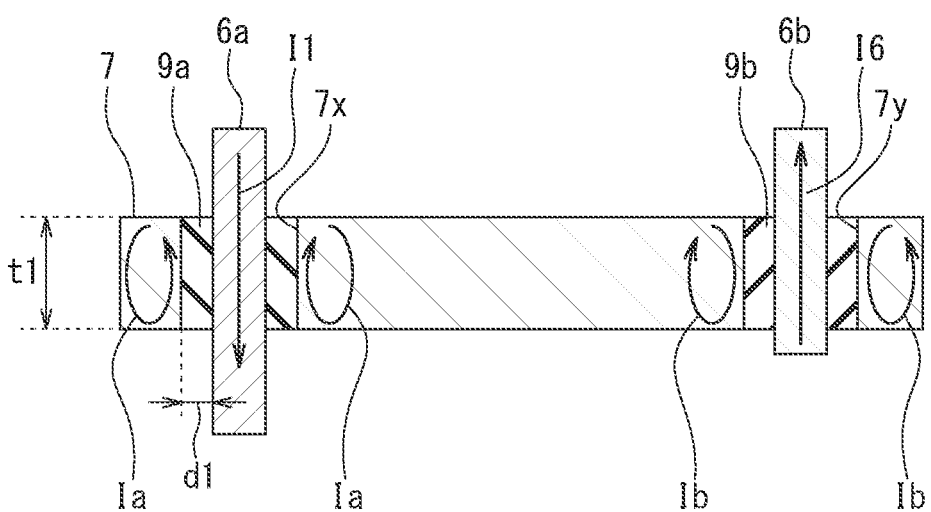
FIG. 3 is a cross-sectional view as viewed from direction A-A in FIG. 2.

With reference to the Drawings, first to seventh embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Moreover, in some drawings, portions are illustrated with different dimensional relationships and proportions. The first to seventh embodiments described below merely illustrate schematically devices and methods for specifying and giving shapes to the technical idea of the present invention, and the span of the technical idea is not limited to materials, shapes, structures, and relative positions of elements described herein.

In the Specification, a "first main electrode" of a semiconductor chip is assigned to an electrode which will be a source electrode or a drain electrode in a field-effect transistor (FET) or a static induction transistor (SIT), an emitter electrode or a collector electrode in an insulated-gate bipolar transistor (IGBT) and an anode electrode or a cathode electrode in a static induction (SI) thyristor, a gate turn-off (GTO) thyristor or a diode.

A "second main electrode" of the semiconductor chip is assigned to an electrode which will not be the first main electrode and will be the source electrode or the drain electrode in the FET or the SIT, the emitter electrode or the collector electrode in the IGBT, and the anode electrode or the cathode electrode in the SI thyristor, the GTO thyristor or the diode.

That is, when the first main electrode is the source electrode, the second main electrode means the drain electrode. When the first main electrode is the emitter electrode, the second main electrode means the collector electrode. When the first main electrode is the anode electrode, the second main electrode means the cathode electrode.

The terms regarding the directions such as "upper", "lower", "upper-lower", "left", "right", and "right-left" as described herein are definitions made only for illustration purposes, and it should be understood that these terms are not intended to limit the technical idea of the present invention. For example, the elements described as being on the "upper" and "lower" sides can be oriented on the "left" and "right" sides when turned over 90 degrees, and can be oriented on the opposite sides when turned over 180 degrees.

First Embodiment

A semiconductor device according to a first embodiment is a "2-in-1" semiconductor module having functions for two power semiconductor elements. As illustrated in FIG. 1, the semiconductor device according to the first embodiment includes an insulated circuit substrate 1, and semiconductor chips 2a and 2b mounted on the insulated circuit substrate 1. A printed circuit board 4 is arranged over and separately from the semiconductor chips 2a and 2b. The respective circumferences of the semiconductor chips 2a and 2b and the printed circuit board 4 are sealed with a sealing member 8 so that the semiconductor chips 2a and 2b and the printed circuit board 4 are electrically insulated from the circumferential elements.

The insulated circuit substrate 1 includes an insulated substrate 11, upper-side conductor layers (conductive plates) 12a and 12b deposited on the top surface of the insulated substrate 11 (on the circuit surface side), and a lower-side conductor layer (a heat-radiating plate) 13 deposited on the bottom surface of the insulated substrate 11 (on the coolant surface side). A predetermined circuit pattern is provided in the respective upper-side conductor layers 12a and 12b, although not illustrated in FIG. 1.

The insulated circuit substrate 1 may be a direct copper bonded (DCB) substrate or an active metal brazed (AMB) substrate, for example. The insulated substrate 11 is a ceramic substrate formed from aluminum oxide ($Al_2O_3$), aluminum nitride (AlN), silicon nitride ($Si_3N_4$), or boron nitride (BN), or a resin insulated substrate using a polymer material, for example. The upper-side conductor layers 12a and 12b and the lower-side conductor layer 13 are each conductive foil formed from copper (Cu) or aluminum (Al), for example.

The semiconductor chips 2a and 2b are bonded onto the upper-side conductor layers 12a and 12b via bonding material such as solder or sintered material (not illustrated) or by use of direct bonding. The semiconductor chips 2a and 2b may each be formed from silicon (Si) material, or formed from wide-bandgap semiconductor material such as silicon carbide (SiC), gallium nitride (GaN), and gallium oxide ($Ga_2O_3$), for example. The semiconductor chips 2a and 2b to be used may each be a power semiconductor element such as a metal-oxide-semiconductor field-effect transistor (MOSFET), a field-effect transistor (FET), an insulated gate bipolar transistor (IGBT), a static induction (SI) thyristor, and a gate turn-off (GTO) thyristor, or a rectifier element such as a freewheeling diode (FWD), while the type to be used can vary depending on the purpose. The present embodiment is illustrated below with a case in which the semiconductor chips 2a and 2b are a MOSFET of SiC.

The semiconductor chips 2a and 2b are each provided with a first main electrode (a drain electrode) on the bottom surface side, and provided with a control electrode (a gate electrode) and a second main electrode (a source electrode) on the top surface side. The drain electrode of the semiconductor chip 2a on the bottom surface side is bonded to the upper-side conductor layer 12a of the insulated circuit substrate 1 via the bonding material such as solder or sintered material, for example. The drain electrode of the semiconductor chip 2b on the bottom surface side is bonded to the upper-side conductor layer 12b of the insulated circuit substrate 1 via the bonding material such as solder or sintered material.

While FIG. 1 illustrates the two semiconductor chips 2a and 2b, the number of the semiconductor chips to be provided is not limited to the case as illustrated, and may be determined as appropriate depending on a rated current and the like. For example, the insulated circuit substrate 1 may include a single semiconductor chip, or may include three or more semiconductor chips.

The semiconductor chips 2a and 2b are connected to the printed circuit board 4 via a plurality of post electrodes (bumps) 3a and 3b. The source electrode of the semiconductor chip 2a is bonded to a lower end of part of the respective post electrodes 3a via bonding material such as solder or sintered material (not illustrated). The gate electrode of the semiconductor chip 2a is bonded to a lower end of the other part of the respective post electrodes 3a via bonding material such as solder or sintered material (not illustrated). The source electrode of the semiconductor chip 2b is bonded to a lower end of part of the respective post electrodes 3b via bonding material such as solder or sintered material (not illustrated). The gate electrode of the semiconductor chip 2b is bonded to a lower end of the other part of the respective post electrodes 3b via bonding material such as solder or sintered material (not illustrated).

The post electrodes 3a and 3b each have a stick-like (pin-like) shape or a pillar-like shape, and more particularly, may have a columnar shape, a cylindroid shape, or a polygonal prism such as a triangular prism and a quadrangular prism. The post electrodes 3a and 3b to be used can be formed from metal material such as copper (Cu). The post electrodes 3a and 3b may be bonded to a lower-side wiring layer 43 on the bottom surface side of the printed circuit board 4, or may penetrate into an upper-side wiring layer 42 on the top surface side of the printed circuit board 4.

The printed circuit board 4 includes an insulating layer 41, the upper-side wiring layer 42 deposited on the top surface of the insulating layer 41, and the lower-side wiring layer 43 deposited on the bottom surface of the insulating layer 41. The insulating layer 41 is a resin substrate formed from polyimide resin or a combination of glass fiber and polyimide resin, for example.

The upper-side wiring layer 42 and the lower-side wiring layer 43 are each conductive foil formed from copper (Cu) or aluminum (Al), for example. Although not illustrated in FIG. 1, a predetermined circuit pattern is provided in each of the upper-side wiring layer 42 and the lower-side wiring layer 43. The upper-side wiring layer 42 and the lower-side wiring layer 43 may be provided with the same circuit pattern, for example. The upper-side wiring layer 42 and the lower-side wiring layer 43 may be electrically connected to each other via through-holes penetrating the insulating layer 41.

The upper-side conductor layer 12a of the insulated circuit substrate 1 is connected with a lower end of an external connection terminal (a drain-side connection terminal) 6a on the high-potential side via bonding material such as solder or sintered material (not illustrated). The drain-side connection terminal 6a extends upward from the insulated circuit substrate 1. An upper end of the drain-side connection terminal 6a projects from the top surface of the sealing member 8 so as to be connected to an external circuit. The drain-side connection terminal 6a is formed from metal material such as copper (Cu). The drain-side connection terminal 6a supplies a current to the drain electrode of the semiconductor chip 2a via the upper-side conductor layer 12a.

An external connection terminal (a source-side connection terminal) 6b on the low-potential side and an external connection terminal (an output terminal) 6c on the output side are connected to the upper-side wiring layer 42 of the printed circuit board 4. The source-side connection terminal 6b extends upward from the printed circuit board 4. An upper end of the source-side connection terminal 6b projects from the top surface of the sealing member 8 so as to be connected to the external circuit. The source-side connection terminal 6b is formed from metal material such as copper (Cu). The source-side connection terminal 6b leads a current from the source electrode of the semiconductor chip 2b to flow to the external circuit through the post electrodes 3b and the printed circuit board 4.

A lower end of the output terminal 6c is connected to the upper-side conductor layer 12b of the insulated circuit substrate 1. The output terminal 6c extends upward from the insulated circuit substrate 1. An upper end of the output terminal 6c projects from the top surface of the sealing member 8 so as to be connected to the external circuit. The output terminal 6c leads a current from the source electrode of the semiconductor chip 2a to flow to the external circuit through the post electrodes 3a and the printed circuit board 4 when the semiconductor chip 2a is in an ON state. The output terminal 6c also leads a current from the external circuit to flow to the drain electrode of the semiconductor chip 2b via the upper-side conductor layer 12b of the insulated circuit substrate 1 when the semiconductor chip 2b is in an ON state.

Although not illustrated, the printed circuit board 4 is connected with a plurality of gate control terminals (external connection terminals) and a plurality of auxiliary source terminals (external connection terminals). The respective gate control terminals apply control signals for controlling the ON/OFF states of the semiconductor chips 2a and 2b to the respective gate electrodes of the semiconductor chips 2a and 2b via the printed circuit board 4 and the post electrodes 3a and 3b. The respective auxiliary source terminals detect the current on the source side of the respective semiconductor chips 2a and 2b via the post electrodes 3a and 3b and the printed circuit board 4.

A conductive block (a conductive member) 7 is provided to surround the outer circumferences of the drain-side connection terminal 6a and the source-side connection terminal 6b. The conductive block 7 is arranged separately over the printed circuit board 4. The conductive block 7 has a cuboidal shape extending in the longitudinal direction of the insulated circuit substrate 1, for example. The conductive block 7 is formed from conductive material of metal such as copper (Cu), a Cu alloy mainly containing Cu, aluminum (Al), or an Al alloy mainly containing Al.

FIG. 2 is a plan view of the conductive block 7, the drain-side connection terminal 6a, the source-side connection terminal 6b, and the output terminal 6c illustrated in FIG. 1. FIG. 3 is a cross-sectional view taken along the conductive block 7 as viewed from direction A-A indicated in FIG. 2. FIG. 2 schematically indicates the outlines of the planar patterns of the insulated circuit substrate 1, the semiconductor chips 2a and 2b, and the printed circuit board 4 by the dash and dotted lines.

The outline of the printed circuit board 4 has an L-shaped planar pattern, as illustrated in FIG. 2, but is not limited to this shape. The conductive block 7 has a rectangular planar pattern, but is not limited to this shape. The drain-side connection terminal 6a and the source-side connection terminal 6b are aligned in the longitudinal direction of the rectangular planar pattern of the insulated circuit substrate 1. The conductive block 7 is provided separately from the output terminal 6c.

As illustrated in FIG. 2 and FIG. 3, the conductive block 7 is provided with a plurality of penetration holes 7x and 7y through which the drain-side connection terminal 6a and the source-side connection terminal 6b penetrate. A thickness t1 of the conductive block 7 is in a range of one millimeter or greater or five millimeters or smaller, for example, but is not limited to this range. A width w1 of the conductive block 7 in the short-side direction of the rectangular planar pattern of the conductive block 7 is in a range of one millimeter or greater and five millimeters or smaller, for example, but is not limited to this range. A distance (a gap) dl between the respective penetration holes 7x and 7y of the conductive block 7 and the respective drain-side connection terminal 6a and source-side connection terminal 6b is in a range of 0.1 millimeters or greater and one millimeter or smaller, for example, but is not limited to this range.

Insulating members (intervening components) 9a and 9b are provided between the respective penetration holes 7x and 7y of the conductive block 7 and the respective drain-side connection terminal 6a and source-side connection terminal 6b. The insulating members 9a and 9b to be used can each be formed from insulating material such as resin. The respective insulating members 9a and 9b have the function of ensuring a predetermined distance between the conductive block 7 and the respective drain-side connection terminal 6a and source-side connection terminal 6b so as not to be brought into contact with each other. Regulating the thickness of the respective insulating members 9a and 9b can adjust the distance (the gap) d 1 between the conductive block 7 and the respective drain-side connection terminal 6a and source-side connection terminal 6b.

The present embodiment is illustrated with the case in which the insulating members 9a and 9b are provided between the respective penetration holes 7x and 7y of the conductive block 7 and the respective drain-side connection terminal 6a and source-side connection terminal 6b, but is not limited to this case. For example, a part of the sealing member 8 may be inserted between respective penetration holes 7x and 7y of the conductive block 7 and the respective drain-side connection terminal 6a and source-side connection terminal 6b, instead of the insulating members 9a and 9b.

The sealing member 8 illustrated in FIG. 1, which composes a casing of the semiconductor device according to the first embodiment, has a substantially cuboidal shape. The insulated circuit substrate 1 is exposed on the bottom surface of the sealing member 8. The sealing member 8 to be used can be formed from resin material, such as thermosetting resin, which is hard and has heat resistance, for example. In particular, the sealing member 8 to be used can be epoxy resin, maleimide resin, or cyanate resin.

Figure 4:
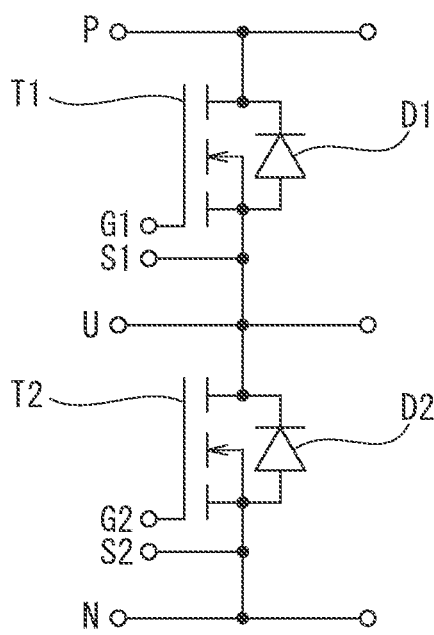
FIG. 4 is an equivalent circuit diagram of the semiconductor device according to the first embodiment.

FIG. 4 is an example of an equivalent circuit diagram of the semiconductor device according to the first embodiment. As illustrated in FIG. 4, the semiconductor device according to the first embodiment implements a part of a three-phase bridge circuit. A second main electrode (a drain electrode) of a transistor T1 on the upper arm side is connected to a drain-side connection terminal P, and a first main electrode (a source electrode) of a transistor T2 on the lower arm side is connected to a source-side connection terminal N. A source electrode of the transistor T1 and a drain electrode of the transistor T2 are connected to an output terminal U and an auxiliary source terminal S1. An auxiliary source terminal S2 is connected to the source electrode of the transistor T2. Gate control terminals G1 and G2 are connected to gate electrodes of the transistors T1 and T2 respectively. Body diodes D1 and D2 serving as freewheeling diodes (FWDs) are connected in antiparallel to and installed in the transistors T1 and T2.

The drain-side connection terminal P, the source-side connection terminal N, and the output terminal U illustrated in FIG. 4 correspond to the drain-side connection terminal 6a, the source-side connection terminal 6b, and the output terminal 6c illustrated in FIG. 1, respectively. The transistors T1 and T2 illustrated in FIG. 4 correspond to the semiconductor chips 2a and 2b illustrated in FIG. 1, respectively. FIG. 1 omits the illustration of the gate control terminals G1 and G2 and the auxiliary source terminals S1 and S2 illustrated in FIG. 4.

The operations of the semiconductor device according to the first embodiment are described below. A control signal for controlling an ON/OFF state of the respective semiconductor chips 2a and 2b is applied through the gate control terminals (not illustrated) to the gate electrode of the respective semiconductor chips 2a and 2b via the printed circuit board 4 and the post electrodes 3a and 3b, so that the semiconductor chips 2a and 2b alternately execute the switching operation.

The arrows I1 to I6 illustrated in FIG. 1 schematically indicate the respective current paths in the semiconductor device according to the first embodiment. A current (indicated by the arrow I1) entering on the drain-side connection terminal 6a side flows to the post electrodes 3a from the semiconductor chip 2a on the upper arm side through the upper-side conductor layer 12a of the insulated circuit substrate 1 (indicated by the arrow I2), and further flows to the external circuit from the output terminal 6c via the printed circuit 4 (indicated by the arrow I3). A current (indicated by the arrow I4) entering the output terminal 6c from the external circuit flows to the post electrodes 3b from the semiconductor chip 2b on the lower arm side through the upper-side conductor layer 12b of the insulated circuit substrate 1 (indicated by the arrow I5), and further flows to the external circuit from the source-side connection terminal 6b via the printed circuit board 4 (indicated by the arrow I6).

A semiconductor device of a comparative example is described below. The semiconductor device of the comparative example differs from the semiconductor device according to the first embodiment illustrated in FIG. 1 in not including the conductive block 7, as illustrated in FIG. 5. An induced electromotive force ΔV as given by the following formula (1) is generated in the semiconductor chips 2a and 2b when the semiconductor device of the comparative example is switched by a power conversion device.

$$\Delta V = Ls - di/dt \qquad (1)$$

In the formula (1), Ls is a parasitic inductance of a conversion circuit unit in the power conversion device. The parasitic inductance is present inside an input capacitor, the semiconductor device of the comparative example, and a connection wire between the input capacitor and the semiconductor device of the comparative example. In the formula (1), di/dt is a rate of change in current upon the switching. The extra induced electromotive force ΔV given by the formula (1) is applied as a surge voltage to the semiconductor chips 2a and 2b, in addition to a DC voltage of the circuit. A rated voltage of the semiconductor chips 2a and 2b needs to be set, in addition to the surge voltage, so as not to exceed a breakdown voltage.

Since the drain-side connection terminal 6a, the source-side connection terminal 6b, and the output terminal 6c are long in the current paths I1 to I6 in the semiconductor device of the comparative example, a proportion of the parasitic inductance of the drain-side connection terminal 6a, the source-side connection terminal 6b, and the output terminal 6c themselves in the entire parasitic inductance of the current paths I1 to I6 is increased, which limits the regulation of the induced voltage upon the switching operation.

The semiconductor device according to the first embodiment includes the conductive block 7, as illustrated in FIG. 1 to FIG. 3. Upon the switching operation of the semiconductor device according to the first embodiment, magnetic fields Ma and Mb are caused due to Ampere's circuital law around the currents flowing through the drain-side connection terminal 6a and the source-side connection terminal 6b, as indicated by the arrows in FIG. 2.

As viewed from the top surface side of the conductive block 7, as illustrated in FIG. 2, the current flows through the drain-side connection terminal 6a from the front side to the back side in the sheet of the drawing. The magnetic field Ma is caused in the clockwise direction around the drain-side connection terminal 6a. The current also flows through the source-side connection terminal 6b in the direction opposite to the drain-side connection terminal 6a from the back side to the front side in the sheet of the drawing. The magnetic field Mb is caused in the counterclockwise direction around the source-side connection terminal 6b.

At this point, eddy currents Ia and Ib are caused in the conductive block 7 in a direction so as to suppress the magnetic fields Ma and Mb caused, as schematically indicate by the arrows in FIG. 3. The eddy currents Ia and Ib offset and decrease the magnetic fields Ma and Mb around the drain-side connection terminal 6a and the source-side connection terminal 6b. This can reduce the parasitic inductance in the drain-side connection terminal 6a and the source-side connection terminal 6b themselves accordingly.

<Method of Manufacturing Semiconductor Device>

An example of a method of manufacturing (a method of assembling) the semiconductor device according to the first embodiment is described below. The insulated circuit substrate 1 illustrated in FIG. 1 is prepared first, and the semiconductor chips 2a and 2b are then deposited on the upper-side conductor layers 12a and 12b of the insulated circuit substrate 1 via bonding material. The post electrodes 3a and 3b are further deposited on the semiconductor chips 2a and 2b via bonding material, and the printed circuit board 4 is also deposited on the post electrodes 3a and 3b via bonding material.

The respective lower ends of the drain-side connection terminal 6a and the output terminal 6c are mounted on the upper-side conductor layers 12a and 12b of the insulated circuit substrate 1 via bonding material, and the lower end of the source-side connection terminal 6b is mounted on the upper-side wiring layer 42 of the printed circuit board 4 via bonding material. The conductive block 7 provided with the insulating members 9a and 9b in the penetration holes 7x and 7y is then prepared, and the drain-side connection terminal 6a and the source-side connection terminal 6b are inserted by pressure to the penetration holes 7x and 7y of the conductive block 7 via the insulating members 9a and 9b. Alternatively, the lower end of the drain-side connection terminal 6a may be connected to the upper-side conductor layer 12a of the insulated circuit substrate 1, and the lower end of the source-side connection terminal 6b may be connected onto the upper-side wiring layer 42 of the printed circuit board 4 after the drain-side connection terminal 6a and the source-side connection terminal 6b are inserted by pressure to the penetration holes 7x and 7y of the conductive block 7 via the insulating members 9a and 9b.

Next, the insulated circuit substrate 1, the semiconductor chips 2a and 2b, the post electrodes 3a and 3b, and the printed circuit board 4 are bonded to each other by heat treatment. The semiconductor chips 2a and 2b, the post electrodes 3a and 3b, the printed circuit board 4, and the conductive block 7 are then sealed by the sealing member 8. The semiconductor device according to the first embodiment illustrated in FIG. 1 is thus completed.

EXAMPLES

Figure 6:
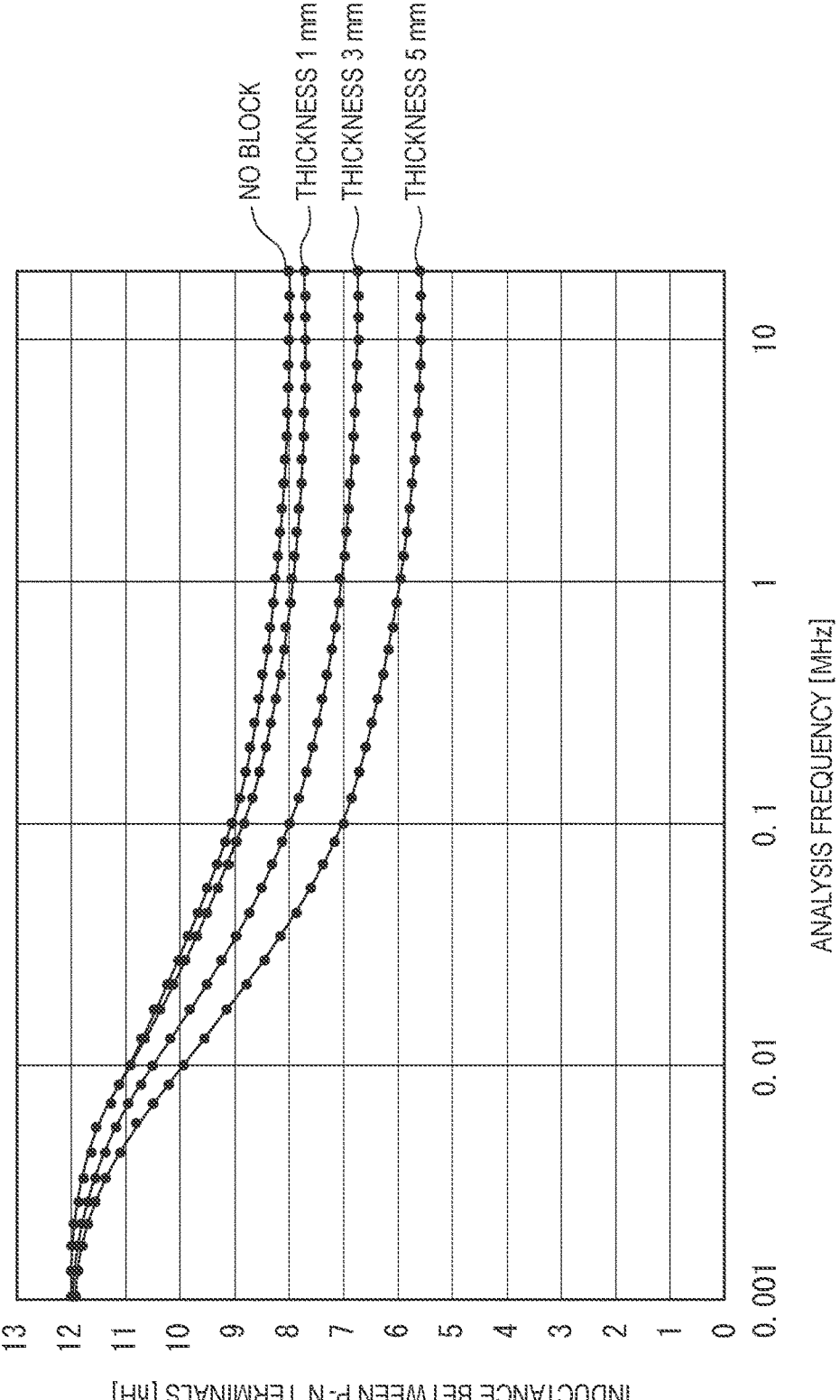
FIG. 6 is a graph showing a relation between an analysis frequency and a P-N terminal inductance when a thickness of a conductive member is changed in the semiconductor device according to the first embodiment.

Next, simulation results of frequency dependence of the inductance between P-N terminals (between the drain-side connection terminal 6a and the source-side connection terminal 6b) are explained in some examples when the respective parameters of the conductive block 7 of the semiconductor device according to the first embodiment are changed. FIG. 6 shows the simulation results of the frequency dependence of the inductance between the P-N terminals in each of an example of the semiconductor device according to the first embodiment in which the thickness t1 of the conductive block 7 is changed to one millimeter, three millimeters, and five millimeters and the comparative example in which the conductive block 7 is not provided. The simulation revealed, as shown in FIG. 6, that the inductance between the P-N terminals is smaller as the thickness t1 of the conductive block 7 is greater.

Figure 7:
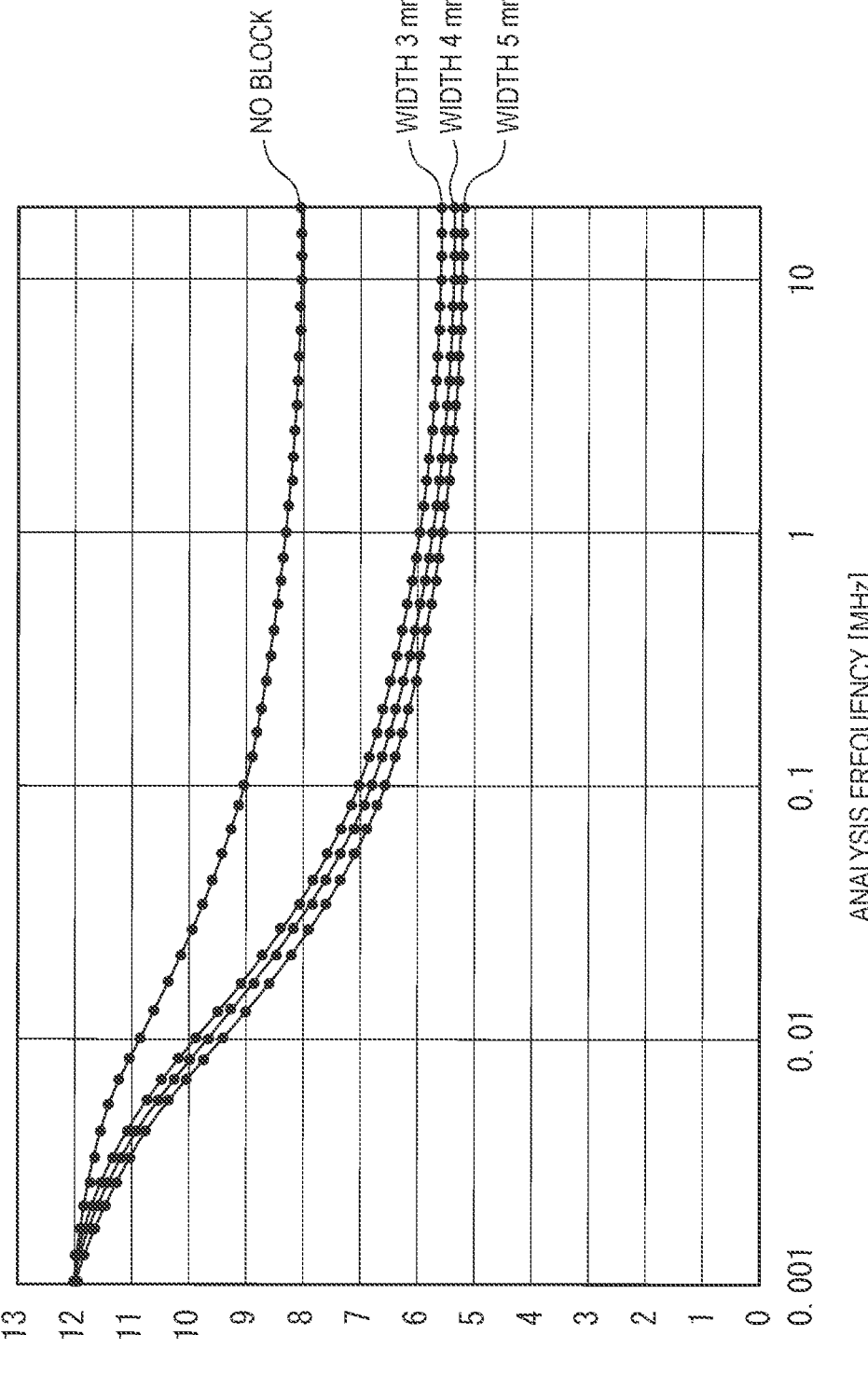
FIG. 7 is a graph showing a relation between the analysis frequency and the P-N terminal inductance when a width of the conductive member is changed in the semiconductor device according to the first embodiment.

FIG. 7 shows the simulation results of the frequency dependence of the inductance between the P-N terminals in each of an example of the semiconductor device according to the first embodiment in which the width w1 of the conductive block 7 is changed to three millimeters, four millimeters, and five millimeters and the comparative example in which the conductive block 7 is not provided. The simulation revealed, as shown in FIG. 7, that the inductance between the P-N terminals is smaller as the width w1 of the conductive block 7 is greater.

Figure 8:
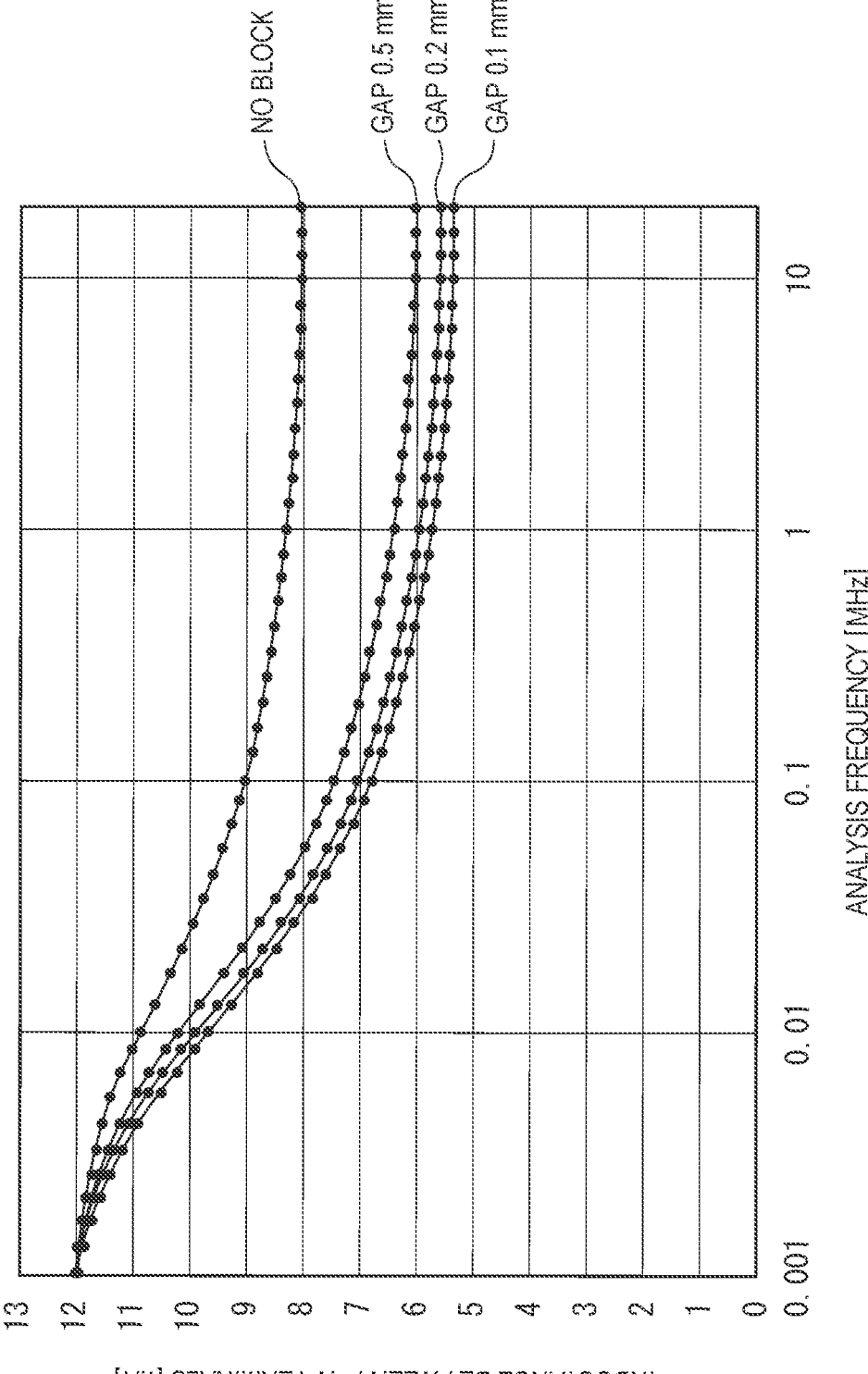
FIG. 8 is a graph showing a relation between the analysis frequency and the P-N terminal inductance when a gap of the conductive member is changed in the semiconductor device according to the first embodiment.

FIG. 8 shows the simulation results of the frequency dependence of the inductance between the P-N terminals in each of an example of the semiconductor device according to the first embodiment in which the gap dl of the conductive block 7 is changed to 0.5 millimeters, 0.2 millimeters, and 0.1 millimeters and the comparative example in which the conductive block 7 is not provided. The simulation revealed, as shown in FIG. 8, that the inductance between the P-N terminals is smaller as the gap dl of the conductive block 7 is smaller.

Figure 9:
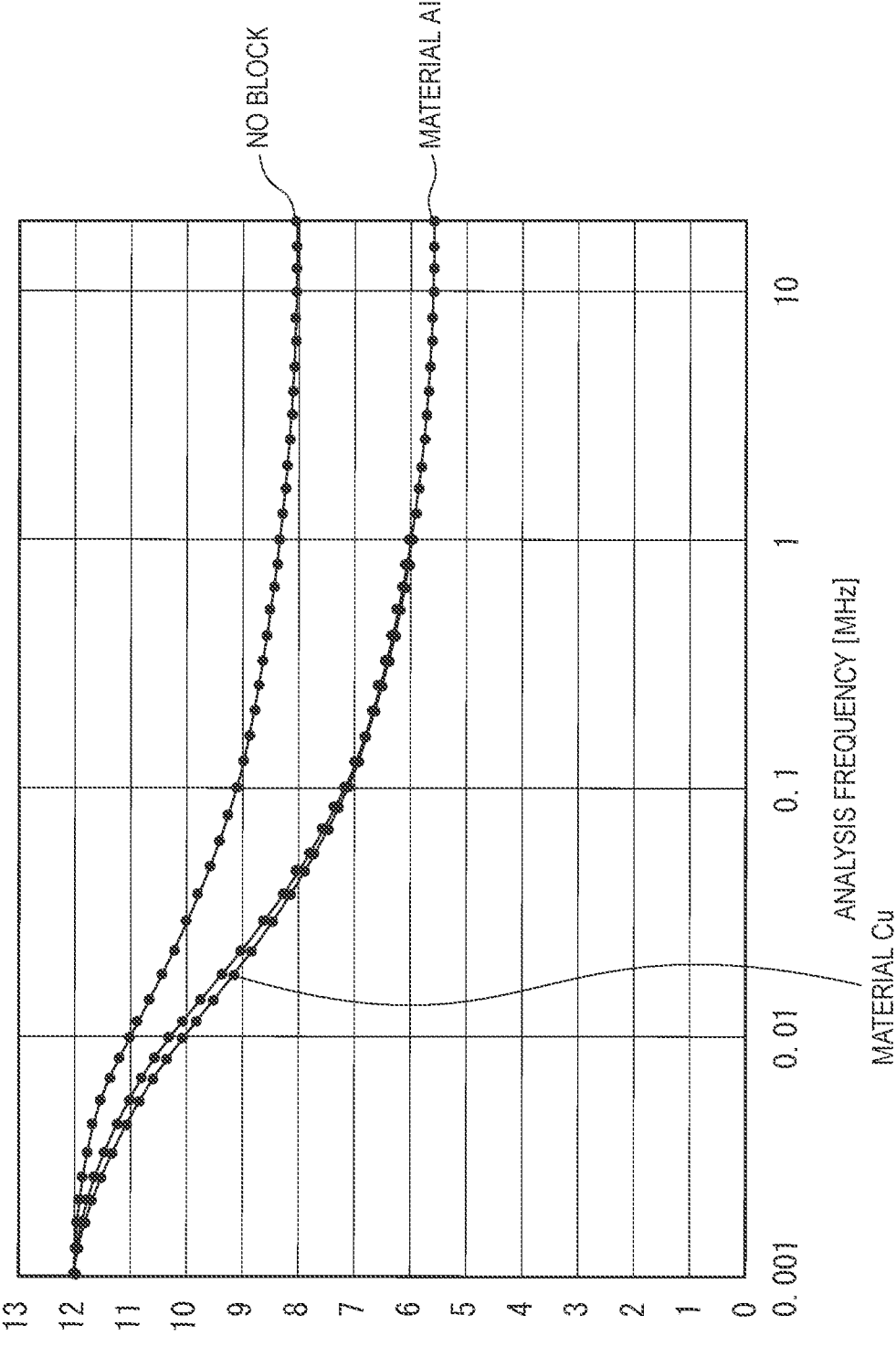
FIG. 9 is a graph showing a relation between the analysis frequency and the P-N terminal inductance when a material of the conductive member is changed in the semiconductor device according to the first embodiment.

FIG. 9 shows the simulation results of the frequency dependence of the inductance between the P-N terminals in each of an example of the semiconductor device according to the first embodiment in which the material used for the conductive block 7 is aluminum (Al) or copper (Cu) and the comparative example in which the conductive block 7 is not provided. The simulation revealed, as shown in FIG. 9, that the use of Al or Cu for the material of the conductive block 7 substantially equally reduces the inductance between the P-N terminals.

<Effects>

As described above, the semiconductor device according to the first embodiment including the conductive block 7 can avoid and decrease the magnetic fields Ma and Mb caused by the currents flowing through the drain-side connection terminal 6a and the source-side connection terminal 6b due to the eddy currents Ia and Ib without a great change in the configuration from the semiconductor device of the comparative example illustrated in FIG. 5. The semiconductor device according to the first embodiment thus can reduce the parasitic inductance in the drain-side connection terminal 6a and the source-side connection terminal 6b themselves and the entire parasitic inductance in the paths of the conversion circuit unit, and can suppress the induced voltage upon the switching operation. In addition, the semiconductor device according to the first embodiment, in which the conductive block 7 extends in the longitudinal direction of the insulated circuit substrate 1, can suppress a warp of the insulated circuit substrate 1.

Second Embodiment

Figure 10:
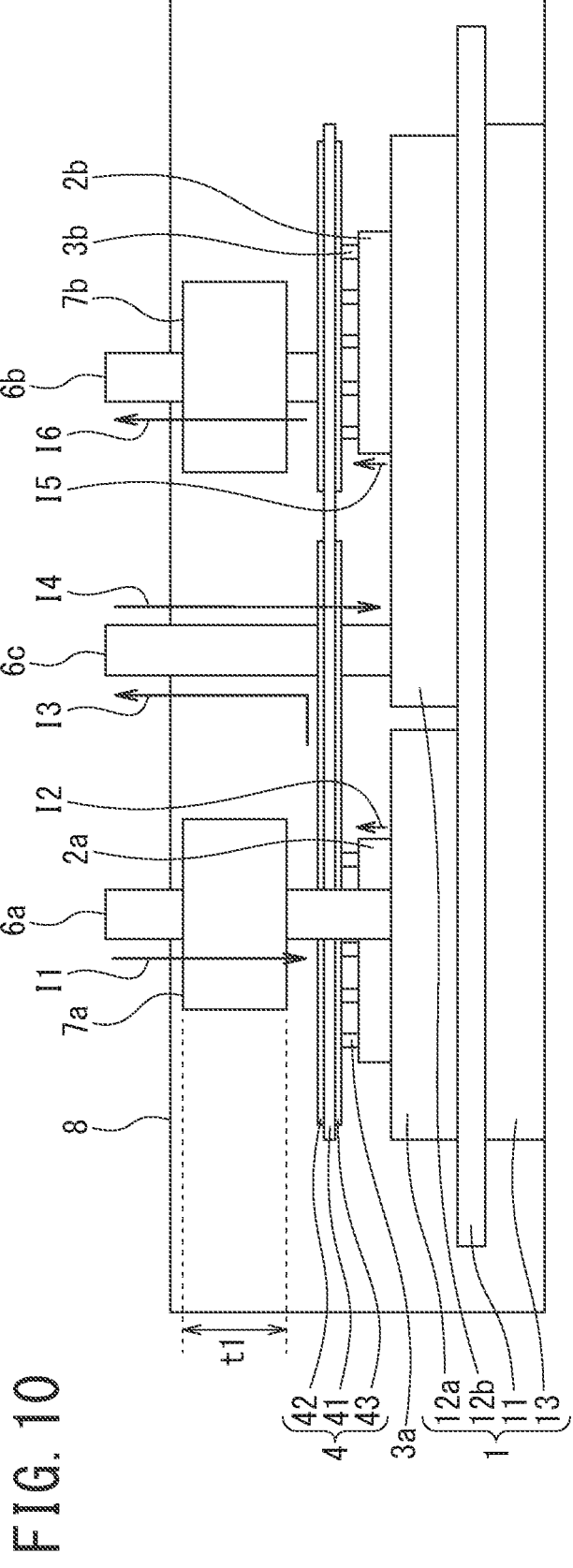
FIG. 10 is a side view illustrating a semiconductor device according to a second embodiment.

A semiconductor device according to a second embodiment differs from the semiconductor device according to the first embodiment illustrated in FIG. 1 in including conductive blocks 7a and 7b independently provided to surround the outer circumferences of the drain-side connection terminal 6a and the source-side connection terminal 6b, as illustrated in FIG. 10.

The conductive blocks 7a and 7b are provided separately from each other. The respective conductive blocks 7a and 7b have the same thickness t1. The outline of the planar pattern of the respective conductive blocks 7a and 7b may be any shape, such as a rectangular shape or a circular shape. The planar pattern of the respective conductive blocks 7a and 7b is not necessarily closed ring-like shape, and may be provided with a cut in a part of the ring-like shape. The semiconductor device according to the second embodiment may exclude either the conductive block 7a or the conductive block 7b and only include the other one.

The other configurations of the semiconductor device according to the second embodiment are the same as those of the semiconductor device according to the first embodiment, and overlapping explanations are not repeated below. The semiconductor device according to the second embodiment can be manufactured by substantially the same method as that for the semiconductor device according to the first embodiment, excluding the step of providing the conductive blocks 7a and 7b independently of each other.

The semiconductor device according to the second embodiment can reduce the parasitic inductance in the drain-side connection terminal 6a and the source-side connection terminal 6b, as in the case of the configuration of the semiconductor device according to the first embodiment. Providing the conductive blocks 7a and 7b independently of each other can make effective use of the space between the respective conductive blocks 7a and 7b.

Third Embodiment

A semiconductor device according to a third embodiment differs from the semiconductor device according to the first embodiment illustrated in FIG. 1 in including conductive blocks 7a and 7b that are provided independently to surround the outer circumferences of the drain-side connection terminal 6a and the source-side connection terminal 6b, and have different thicknesses t1 and t2, as illustrated in FIG. 11.

While FIG. 11 illustrates the case in which the thickness t1 of the conductive block 7a surrounding the outer circumference of the drain-side connection terminal 6a is greater than the thickness t2 of the conductive block 7b surrounding the outer circumference of the source-side connection terminal 6b, the thickness t1 of the conductive block 7a may be smaller than the thickness t2 of the conductive block 7b instead. The other configurations of the semiconductor device according to the third embodiment are the same as those of the semiconductor device according to the first embodiment, and overlapping explanations are not repeated below. The semiconductor device according to the third embodiment can be manufactured by substantially the same method as that for the semiconductor device according to the first embodiment, excluding the step of independently providing the conductive blocks 7a and 7b having the different thicknesses t1 and t2.

The semiconductor device according to the third embodiment can reduce the parasitic inductance in the drain-side connection terminal 6a and the source-side connection terminal 6b, as in the case of the configuration of the semiconductor device according to the first embodiment. Providing the conductive blocks 7a and 7b having the different thicknesses t1 and t2 independently to surround the outer circumferences of the drain-side connection terminal 6a and the source-side connection terminal 6b can make effective use of the space between the respective conductive blocks 7a and 7b, and can regulate the reduced amount of the parasitic inductance in the drain-side connection terminal 6a and the source-side connection terminal 6b independently of each other.

Fourth Embodiment

Figure 12:
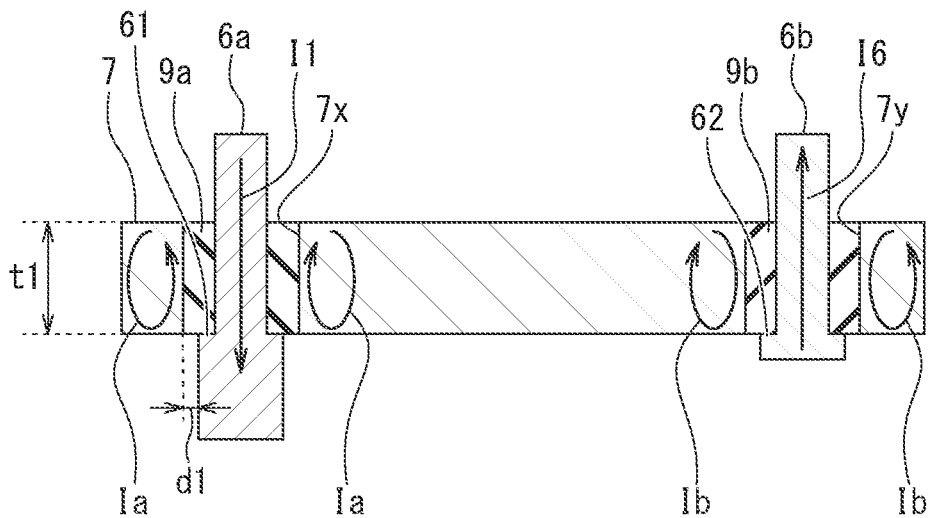
FIG. 12 is a cross-sectional view illustrating a part of a semiconductor device according to a fourth embodiment.

A semiconductor device according to a fourth embodiment differs from the semiconductor device according to the first embodiment illustrated in FIG. 3 in including steps 61 and 62 provided at the outer circumferences of the drain-side connection terminal 6a and the source-side connection terminal 6b under the conductive block 7, as illustrated in FIG. 12.

While FIG. 12 illustrates the case in which the steps 61 and 62 are in contact with the bottom surface of the conductive block 7, the steps 61 and 62 may be separated from the conductive block 7. To avoid the contact between the respective steps 61 and 62 and the conductive block 7, the steps 61 and 62 are set to be smaller than the distance (the gap) d1 between the conductive block 7 and the respective drain-side connection terminal 6a and source-side connection terminal 6b.

The other configurations of the semiconductor device according to the fourth embodiment are the same as those of the semiconductor device according to the first embodiment, and overlapping explanations are not repeated below. The semiconductor device according to the fourth embodiment can be manufactured by substantially the same method as that for the semiconductor device according to the first embodiment, excluding the step of providing the drain-side connection terminal 6a and the source-side connection terminal 6b with the steps 61 and 62.

The semiconductor device according to the fourth embodiment can reduce the parasitic inductance in the drain-side connection terminal 6a and the source-side connection terminal 6b, as in the case of the configuration of the semiconductor device according to the first embodiment. The steps 61 and 62 provided at the outer circumferences of the drain-side connection terminal 6a and the source-side connection terminal 6b under the conductive block 7 serve as stoppers when the conductive block 7 is inserted by pressure to the drain-side connection terminal 6a and the source-side connection terminal 6b upon the assembly of the semiconductor device according to the fourth embodiment, so as to avoid the contact between the conductive block 7 and the printed circuit board 4.

Fifth Embodiment

Figure 13:
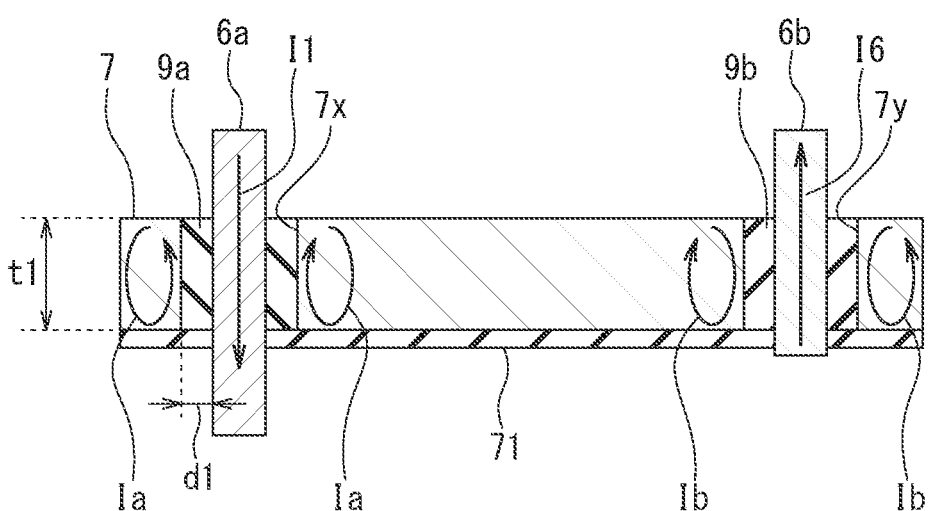
FIG. 13 is a cross-sectional view illustrating a part of a semiconductor device according to a fifth embodiment.

A semiconductor device according to a fifth embodiment differs from the semiconductor device according to the first embodiment illustrated in FIG. 3 in including an insulating layer 71 deposited on the bottom surface of the conductive block 7, as illustrated in FIG. 13. The insulating layer 71 is provided to cover the entire bottom surface of the conductive block 7. The insulating layer 71 is formed from insulating material such as resin.

The other configurations of the semiconductor device according to the fifth embodiment are the same as those of the semiconductor device according to the first embodiment, and overlapping explanations are not repeated below. The semiconductor device according to the fifth embodiment can be manufactured by substantially the same method as that for the semiconductor device according to the first embodiment, excluding the step of preparing the conductive block 7 provided with the insulating layer 71 on the bottom surface.

The semiconductor device according to the fifth embodiment can reduce the parasitic inductance of the drain-side connection terminal 6a and the source-side connection terminal 6b, as in the case of the configuration of the semiconductor device according to the first embodiment. Providing the insulating layer 71 on the bottom surface of the conductive block 7 can avoid the contact between the conductive block 7 and the printed circuit board 4 upon the assembly of the semiconductor device according to the fifth embodiment.

Sixth Embodiment

Figure 14:
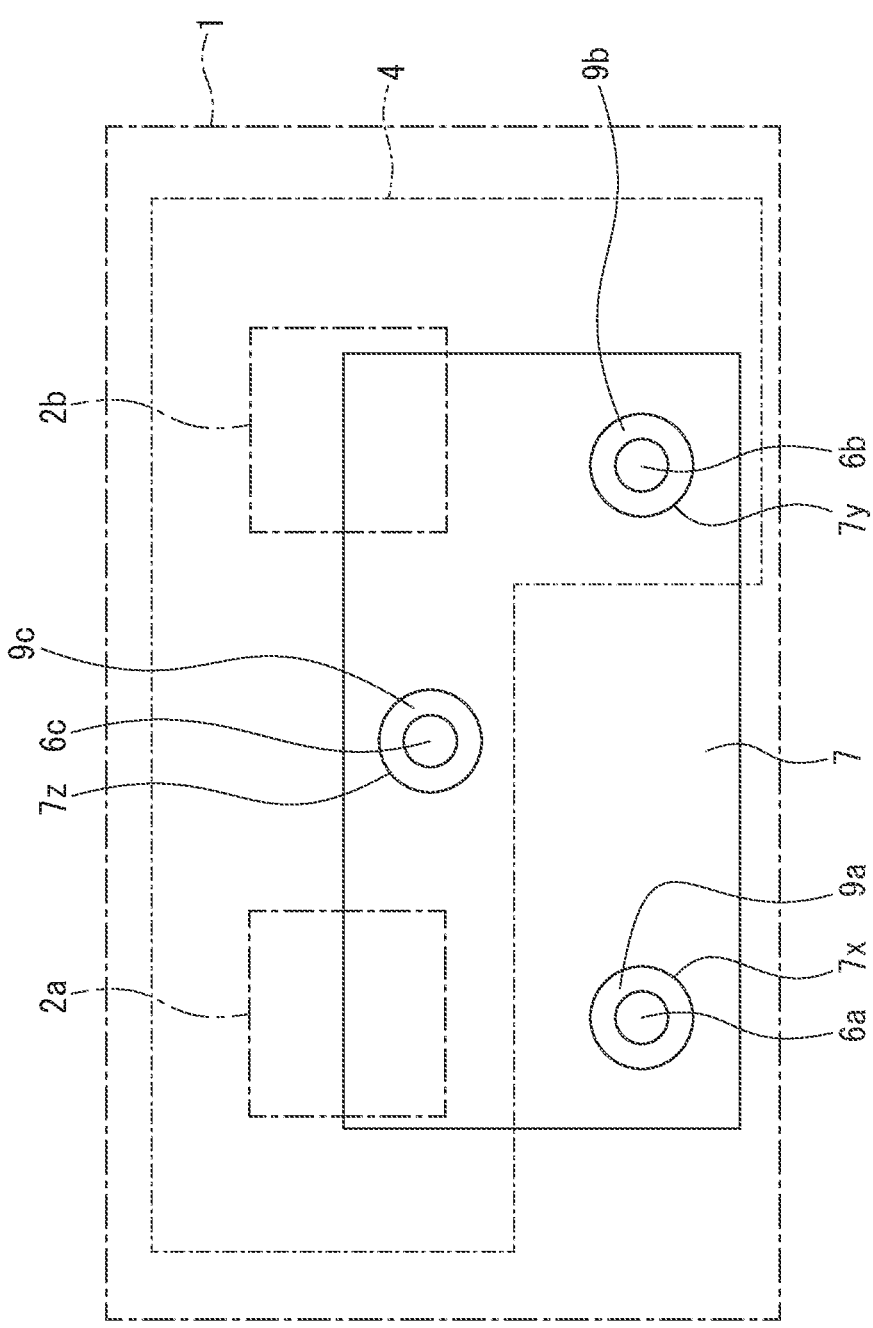
FIG. 14 is a plan view illustrating a part of a semiconductor device according to a sixth embodiment.

A semiconductor device according to a sixth embodiment differs from the semiconductor device according to the first embodiment illustrated in FIG. 2 in that the conductive block 7 is provided to further surround the outer circumference of the output terminal 6c in addition to the drain-side connection terminal 6a and the source-side connection terminal 6b, as illustrated in FIG. 14.

The conductive block 7 is provided with three penetration holes 7x, 7y, and 7z. The output terminal 6c is provided to penetrate through the penetration hole 7z of the conductive block 7. An insulating member 9c is provided between the penetration hole 7z of the conductive block 7 and the output terminal 6c. The other configurations of the semiconductor device according to the sixth embodiment are the same as those of the semiconductor device according to the first embodiment, and overlapping explanations are not repeated below. The semiconductor device according to the sixth embodiment can be manufactured by substantially the same method as that for the semiconductor device according to the first embodiment, excluding the step of inserting by pressure the drain-side connection terminal 6a, the source-side connection terminal 6b, and the output terminal 6c to the respective penetration holes 7x, 7y, and 7z of the conductive block 7.

The semiconductor device according to the sixth embodiment can reduce the parasitic inductance of the drain-side connection terminal 6a and the source-side connection terminal 6b, as in the case of the configuration of the semiconductor device according to the first embodiment. Providing the conductive block 7 to further surround the outer circumference of the output terminal 6c in addition to the drain-side connection terminal 6a and the source-side connection terminal 6b can also reduce the parasitic inductance of the output terminal 6c itself.

Seventh Embodiment

Figure 15:
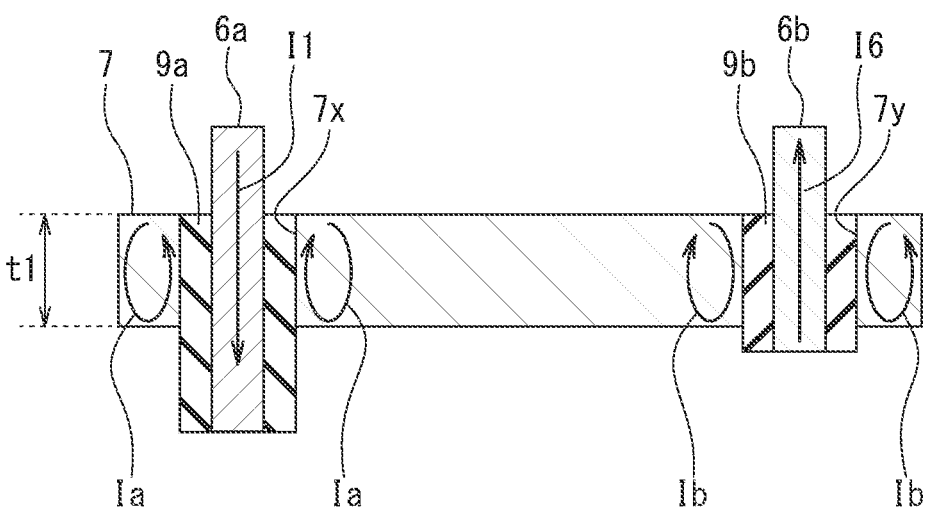
FIG. 15 is a cross-sectional view illustrating a part of a semiconductor device according to a seventh embodiment.

A semiconductor device according to a seventh embodiment differs from the semiconductor device according to the first embodiment illustrated in FIG. 3 in that the insulating members 9a and 9b further extend downward under the bottom surface of the conductive block 7, as illustrated in FIG. 15. The other configurations of the semiconductor device according to the seventh embodiment are the same as those of the semiconductor device according to the first embodiment, and overlapping explanations are not repeated below. The semiconductor device according to the seventh embodiment can be manufactured by substantially the same method as that for the semiconductor device according to the first embodiment.

The semiconductor device according to the seventh embodiment can reduce the parasitic inductance of the drain-side connection terminal 6a and the source-side connection terminal 6b, as in the case of the configuration of the semiconductor device according to the first embodiment. While FIG. 15 illustrates the case in which the insulating members 9a and 9b extend downward under the bottom surface of the conductive member 7, the insulating members 9a and 9b may extend to a position above the top surface of the conductive block 7 to a level without impeding the contact of the respective upper ends of the drain-side connection terminal 6a and the source-side connection terminal 6b with the external circuit.

OTHER EMBODIMENTS

While the present invention has been illustrated by reference to the first to seventh embodiments, it should be understood that the present invention is not intended to be limited to the descriptions and the drawings composing part of this disclosure. It will be apparent to those skilled in the art that the present invention includes various alternative embodiments, examples, and technical applications according to the technical idea disclosed in the above embodiments.

While the respective first to seventh embodiments are illustrated above with the case in which the semiconductor device is the "2-in-1" semiconductor module having the functions for two power semiconductor elements, the present invention may also be applied to a configuration of a "1-in-1" semiconductor module with the functions for a single power semiconductor element.

The configurations disclosed in the first to seventh embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor device comprising:
an insulated circuit substrate including a first conductive plate on a top surface side and a second conductive plate on the top surface side;
a first semiconductor chip mounted on the first conductive plate and a second semiconductor chip mounted on the second conductive plate;
a printed circuit board provided over and electrically connected to the first semiconductor chip and to the second semiconductor chip, the printed circuit board comprising an insulating layer extending over the first semiconductor chip and the second semiconductor chip;
a first external connection terminal electrically connected to the first conductive plate and extending upward from the first conductive plate;
a second external connection terminal electrically connected to the second conductive plate and extending upward from the second conductive plate;
a third external connection terminal electrically connected to the second semiconductor chip and extending upward from the printed circuit board;
a conductive block provided to surround an outer circumference of the first external connection terminal and to be insulated from the first external connection terminal by a first insulating member comprising resin, to surround the second external connection terminal and to be insulated from the second connection terminal by a second insulating member comprising resin, and to surround the third connection terminal and to be insulated from the third connection terminal by a third insulating member comprising resin; and
a sealing member provided to seal the first semiconductor chip, the second semiconductor chip, the printed circuit board, and the conductive block,
wherein the first insulating member to maintain a predetermined distance between the first external connection terminal and the conductive block, and the predetermined distance is one millimeter or smaller, and
the conductive block is provided with a penetration hole through which the first external connection terminal penetrates.

2. The semiconductor device of claim 1, wherein the conductive block includes copper or aluminum.

3. The semiconductor device of claim 1, wherein a part of the sealing member is provided between the first external connection terminal and the conductive block.

4. The semiconductor device of claim 1, wherein a lower end of the first external connection terminal is bonded to the first conductive plate.

5. The semiconductor device of claim 1, wherein the outer circumference of the first external connection terminal is provided with a step at a position under a bottom surface of the conductive block.

6. The semiconductor device of claim 1, further comprising an insulating layer deposited on a bottom surface of the conductive block.

7. The semiconductor device of claim 1, wherein currents flow through the first external connection terminal and the second external connection terminal in directions opposite to each other.

8. The semiconductor device of claim 1, wherein the conductive block is provided to extend in a longitudinal direction of the insulated circuit substrate.

9. The semiconductor device of claim 1, wherein an upper end of the first external connection terminal project from a top surface of the sealing member.

10. The semiconductor device of claim 9, wherein the conductive block is provided over the printed circuit board.

11. The semiconductor device of claim 1, wherein the first conductive block has a thickness five millimeters or smaller.

12. The semiconductor device of claim 1, wherein a thickness of the conductive block is one millimeter or greater.

\* \* \* \* \*